(12) United States Patent
Namba

(10) Patent No.: US 7,319,505 B2
(45) Date of Patent: Jan. 15, 2008

(54) EXPOSURE APPARATUS AND DEVICE FABRICATION METHOD

(75) Inventor: Hisashi Namba, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 641 days.

(21) Appl. No.: 10/871,210

(22) Filed: Jun. 18, 2004

(65) Prior Publication Data

US 2004/0256574 A1 Dec. 23, 2004

(30) Foreign Application Priority Data

Jun. 18, 2003 (JP) ............................. 2003-172862
May 10, 2004 (JP) ............................. 2004-139681

(51) Int. Cl.
G03B 27/52 (2006.01)
G03B 27/62 (2006.01)

(52) U.S. Cl. .......................................... 355/30; 355/75
(58) Field of Classification Search .................. 355/30, 355/53, 72–76; 359/819–820
See application file for complete search history.

(56) References Cited

U.S. PATENT DOCUMENTS

| 5,884,009 | A | 3/1999 | Okase |
| 6,020,950 | A * | 2/2000 | Shiraishi ...................... 355/30 |
| 6,084,938 | A | 7/2000 | Hara et al. |
| 6,463,119 | B1 * | 10/2002 | Terashima et al. ............ 378/34 |
| 6,509,951 | B2 * | 1/2003 | Loopstra et al. .............. 355/30 |
| 6,514,073 | B1 * | 2/2003 | Toshima et al. .............. 432/85 |
| 6,954,258 | B2 * | 10/2005 | Emoto ......................... 355/72 |
| 6,992,306 | B2 * | 1/2006 | Honda et al. ............. 250/492.2 |
| 2003/0012009 | A1 | 1/2003 | Suzuki et al. |
| 2003/0031017 | A1 | 2/2003 | Tsuji |

FOREIGN PATENT DOCUMENTS

| EP | 1 280 008 A2 | 1/2003 |
| JP | 09-306834 | 11/1997 |
| JP | 11-54496 | 2/1999 |
| JP | 2003-31017 | 1/2003 |
| JP | 2003-45774 | 2/2003 |
| JP | 2003-58258 | 2/2003 |

* cited by examiner

*Primary Examiner*—Henry Hung Nguyen
(74) *Attorney, Agent, or Firm*—Morgan & Finnegan, LLP

(57) ABSTRACT

In order to improve a responsiveness of the radiation cooling and to switch a cooling position, an exposure apparatus for exposing an object includes a cooling mechanism for radiation-cooling the object, and a regulator for regulating a radiant heat transfer amount between said cooling mechanism and the object.

21 Claims, 19 Drawing Sheets

EXPOSURE APPARATUS AND DEVICE FABRICATION METHOD

This application claims a benefit of a foreign priority based on Japanese Patent Applications Nos. 2003-172862, filed on Jun. 18, 2003, and 2004-139681, filed on May 10, 2004, each of which is hereby incorporated by reference herein in its entirety as if fully set forth herein.

BACKGROUND OF THE INVENTION

The present invention relates generally to an exposure apparatus for exposing a plate as an object, and more particularly to cooling of the object in the exposure apparatus that uses light in the X-ray and ultraviolet regions or electron beams as exposure light.

In exposure, an exposure apparatus irradiates exposure light onto a wafer and causes wafer's thermal expansions. A wafer chuck usually restrains the wafer, and thus an offset between them seldom occurs.

However, when the shearing force exceeds the chuck's restraint force, the wafer offsets from the wafer chuck. Cooling of the wafer is necessary to avoid the offset and to reduce the wafer's expansion.

Conventional exposure apparatuses use an i-line lamp having a wavelength of about 365 nm, a KrF excimer laser having a wavelength of about 248 nm, and an ArF excimer laser having a wavelength of about 193 nm as a light source, and the light from the light sources with these wavelengths does not attenuate in the air and is applicable to exposure in the air.

The exposure in the air enables the gas to be filled between the wafer and the chuck, the energy applied to the wafer to be transmitted to the chuck through the gas between them, and the heat to be collected by cooling the wafer held by the chuck with coolant. Cooling using heat transmissions through the air from a wafer surface is available. See, for example, Japanese Patent Application No. 09-306834, corresponding to U.S. Pat. No. 6,084,938.

It is predicted the advanced fine processing of the recently promoted semiconductor integrated circuits advances will use a shorter wavelength of the exposure light down to the extremely ultraviolet light having a wave range between 5 and 20 nm.

However, the EUV light attenuates greatly in the air and is viable only in the vacuum environment in which cooling using the heat transmissions through the air is not available. The temperature control becomes thus difficult in the vacuum environment.

The electron beam also greatly attenuates its energy in the air, and faces similar difficulties when is used as the exposure light.

Most conventional cooling methods in the vacuum are classified into a cooling method that uses heat conductions in the solid through coolant, and a method for controlling the temperature of a target by directly controlling the temperature of a radiation plate.

The heat flux in the radiation heat transfer is very small between two objects with a small temperature difference between them. Efficient heat transfer needs a large heat flux, and therefore a large temperature difference between the wafer and the radiation plate is needed for efficient heat transfer. This condition requires the significantly lowered temperature of the radiation plate. On the other hand, it is difficult for such a temperature control means that directly controls the radiation plate using a Peltier element, etc. to suddenly change the radiation plate's temperature. When the thermal load turns on and off, as the exposure heat, the temperature control means cannot follow the temperature changes of the object to be controlled.

In addition, a so-called scanner for scanning a reticle and a wafer relative to the exposure light, and for exposing a reticle pattern onto the wafer generally fixes an exposure position and moves a stage relative to the exposure position for exposure. Thus, as the stage moves, an exposed and heated area moves on the wafer. Therefore, fixing of a cooling position causes a distortion in the wafer when the stage's moving direction changes because unheated part is cooled.

Responsive radiation cooling and switching of a cooling position have been thus demanded.

BRIEF SUMMARY OF THE INVENTION

Accordingly, it is an exemplary object of the present invention to improve a responsiveness of the radiation cooling and to switch a cooling position.

An exposure apparatus according to one aspect of the present invention configured to expose a substrate includes an optical system configured to introduce exposure light to the substrate, a cooling mechanism configured to cool the substrate through radiation, and a regulator configured to selectively regulate an amount of radiant of the cooling mechanism applied to different areas on the substrate so that a radiant amount of part of the cooling mechanism used to cool an unexposed area on the substrate is smaller than a radiant amount of part of the cooling mechanism used to cool an exposed area on the substrate.

Other objects and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description serve to explain the principles of the invention.

DETAILED DESCRIPTION OF THE PREFERRED EMBODIMENTS

Preferred embodiments of the present invention will now be described in detail in accordance with the accompanying drawings.

First Embodiment

Figure 1:
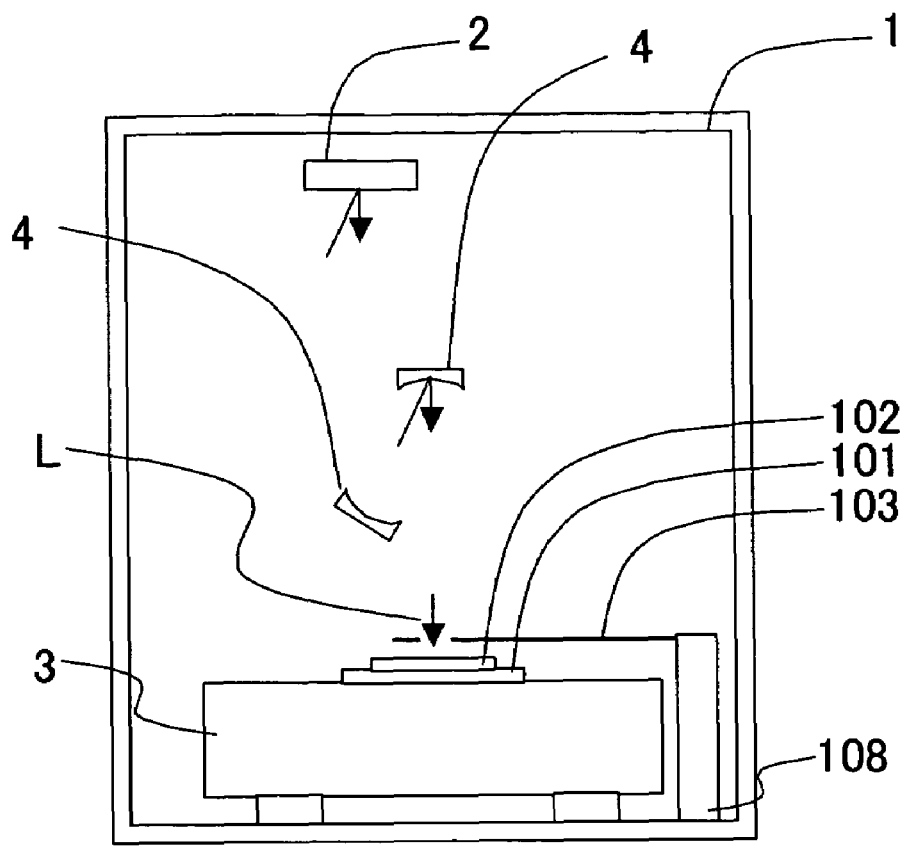
FIG. 1 is a schematic structure of an exposure apparatus of one aspect according to the present invention.

FIG. 1 is a schematic structure of one exemplary exposure apparatus of a first embodiment according to the present invention. The chamber 1 is to separate an exposure atmosphere from the air, and maintains vacuum by a pump (not shown). Exposure light L from a light source (not shown) is introduced into a reticle (or a mask) 2 by an illumination optical system (not shown). The instant embodiment uses a EUV light source as a light source. The EUV light source may use a discharge excitation plasma type EUV light source (or a discharge produced plasma light source), a laser excitation type plasma EUV light source, etc. The illumination optical system includes a mirror and a reflection integrator, and can use, for example, an illumination optical system disclosed in Japanese Patent Application No. 2003-045774 (corresponding to U.S. Pat. No. 2003-031017).

The exposure light L reflected on the reflection reticle 2 is introduced into a wafer 102 as an object to be exposed, via a mirror 4 in the projection optical system, and a pattern on the reticle 2 is projected onto wafer 102. The projection optical system may use, for example, six aspheric multilayer mirrors.

The exposure apparatus of the instant embodiment is a so-called scanner, which scans the reticle 2 and the wafer 10 relative to the exposure light L, and transfers a pattern on the reticle 2 onto the wafer 102.

Figure 2:
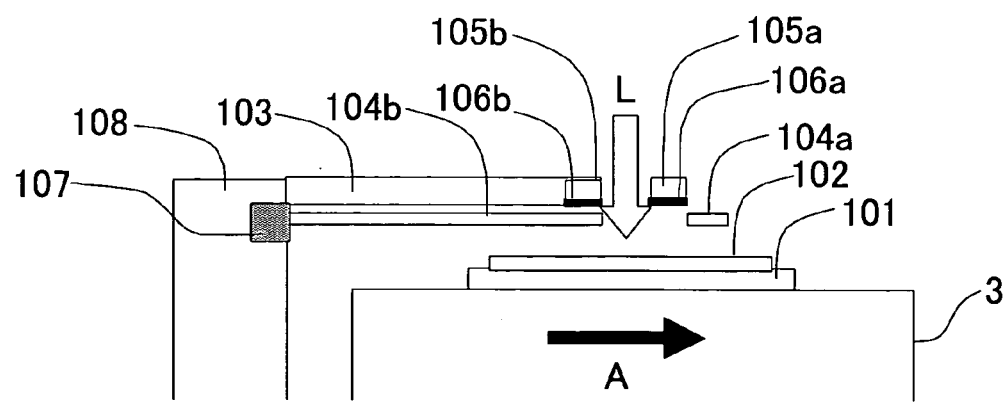
FIG. 2 is a schematic structure of a wafer stage of a first embodiment according to the present invention.

FIG. 2 is a schematic structure of the wafer stage of the exposure apparatus shown in FIG. 1. A radiation plate 106 is used to radiation-cool the local thermal load on the wafer. The radiation plate is temperature-controlled by Peltier elements, which are held by support members 103 and 108. The Peltier elements 105, the radiation plate 106, and support members 103 and 108 constitute a cooling mechanism.

A radiation shutter 104 for adjusting a radiant heat transfer amount (i.e., a heat exchange amount through radiation) between the radiation plate 106 and the wafer is located between them. The radiation shutter 104 is made from or covered with a low emissivity material. The radiation shutter 104 shields radiations from the radiation plate 106 so that radiations from the radiation plate 106 do not influence the wafer 102. The radiation shutters 104a and 104b are configured independently slidable by a drive mechanism 107, and two radiation plates 106 can independently turn on and off.

Figure 3:
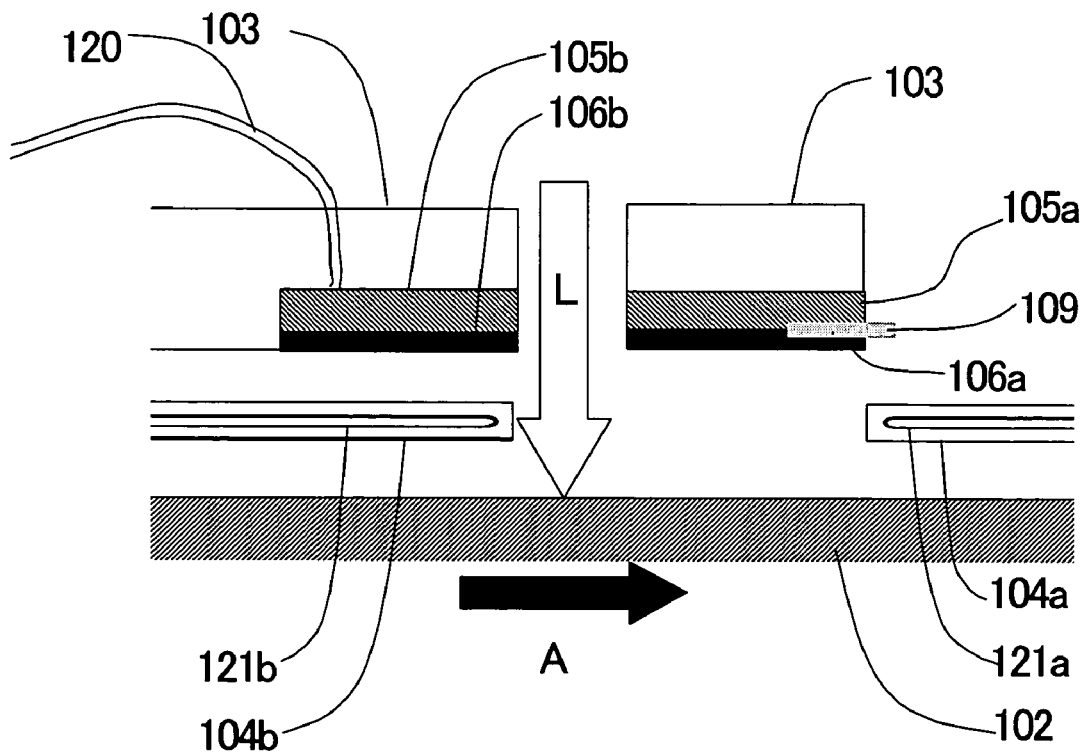
FIG. 3 is a view of a cooling mechanism part of a first embodiment according to the present invention.

FIG. 3 shows a part of cooling mechanism part in the exposure apparatus shown in FIG. 1. A control mechanism (not shown) controls the temperature of the radiation plate through feedback controls over the temperature measured by a temperature sensor 109. On the rear surface of the Peltier element 105, a pipe 120 for supplying the coolant is provided as a temperature control mechanism.

The radiation shutter 104 is subject to the influence of the exposure light L irradiated onto the radiation plate 106 and the wafer 102. The temperature variations of the radiation shutter 104 would affect the radiations from the radiation shutter 104 to the wafer. Accordingly, the pipe 121 for supplying the coolant to maintain the temperature of the radiation shutter 104 constant is provided as the temperature control part in the shutter 104.

Figure 4A:
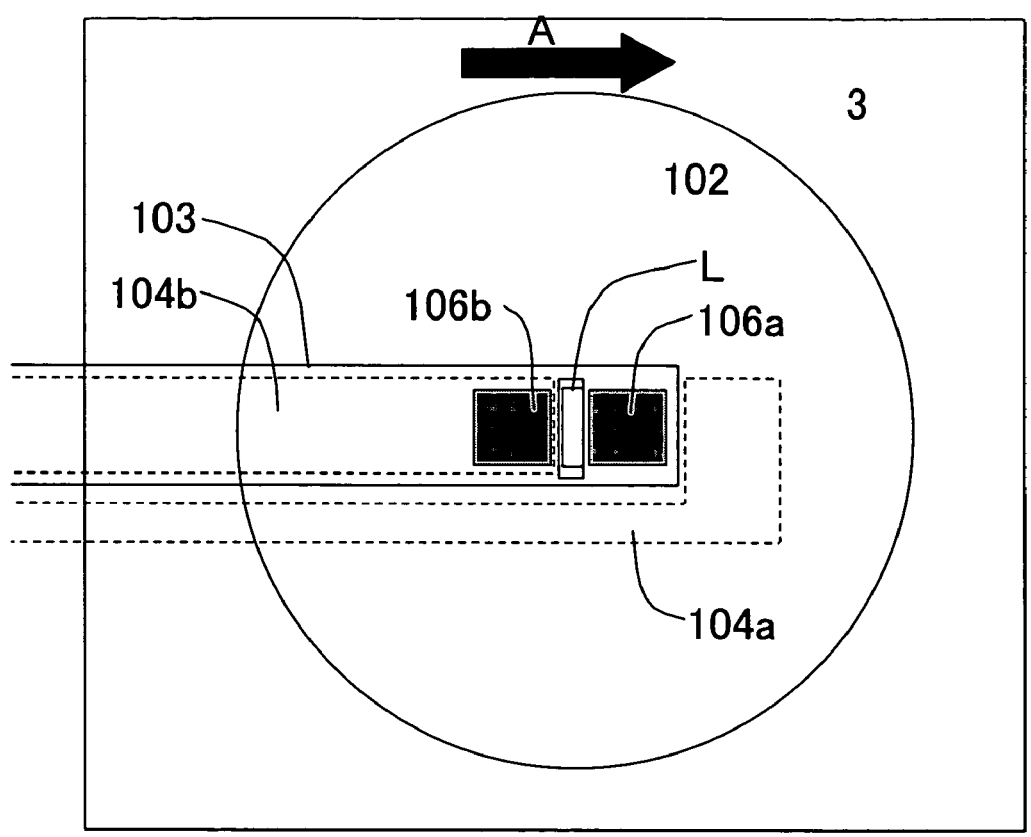
FIGS. 4A to 4C show switching of a radiation cooling position of the first embodiment according to the present invention.
Figure 4B:
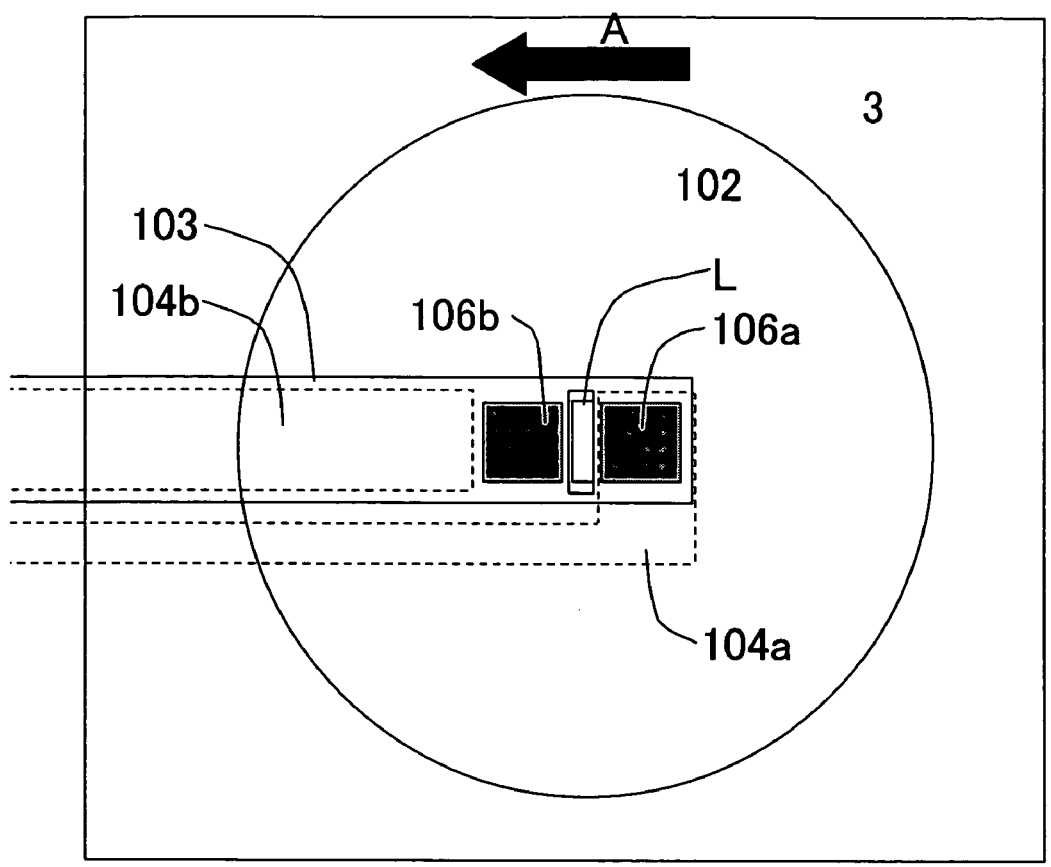
Figure 4C:
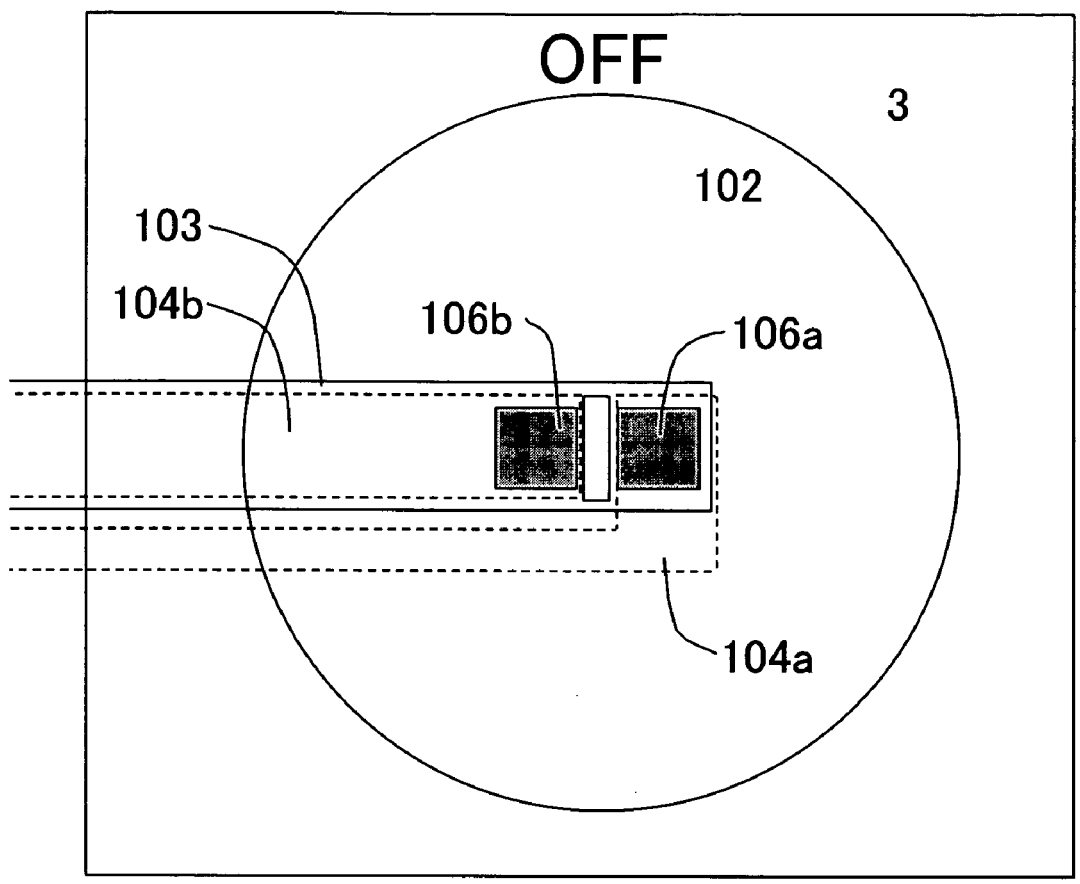

FIGS. 4A, 4B and 4C indicate a method of switching cooling positions in the scan direction. As the radiation shutter 104a (a radiation shutter 104a in FIG. 4A) opens, which is located at the moving direction A side of the stage 3 viewed from the exposed area, the exposed part moves to a position opposite to the radiation plate 106a and only the exposed part can be cooled just after the wafer 102 is exposed. When the moving direction A of the stage 3 is reversed (as shown in FIG. 4B), the radiation shutter 104a shuts and the radiation shutter 104b opens. Thereby, the exposed part moves to a position opposite to the radiation plate 106b, and cools only the exposed part just after the wafer 102 is exposed. When the exposure light L is not irradiated, the radiation shutters 104a, 104b closes as shown in FIG. 4C to shield the influence of the radiation by the radiation plates 106a and 106b. The predetermined exposure sequence can remove the irradiation energy applied to the wafer immediately after the exposure, through operations in FIGS. 4A, 4B and 4C.

Thus, the instant embodiment slides a radiation shutter between the radiation plate and the object to be exposed, and prevents the radiation plate from transmitting radiation to the object at the opposite side, and promptly creates the temperature control OFF state.

Conversely, the temperature control is switched from an Off state to an On state by sliding the radiation shutter away from between the radiation plate and the object to not shield the radiation from the radiation plate. Thereby, the radiation cooling turns on and off with good responsiveness.

In cooling the wafer, the instant embodiment does not cool the unexposed area on the wafer, and reduces the shrinkage of the wafer caused by the excessive cooling to the unexposed area on the wafer and the local distortion on the wafer.

Second Embodiment

Figure 5A:
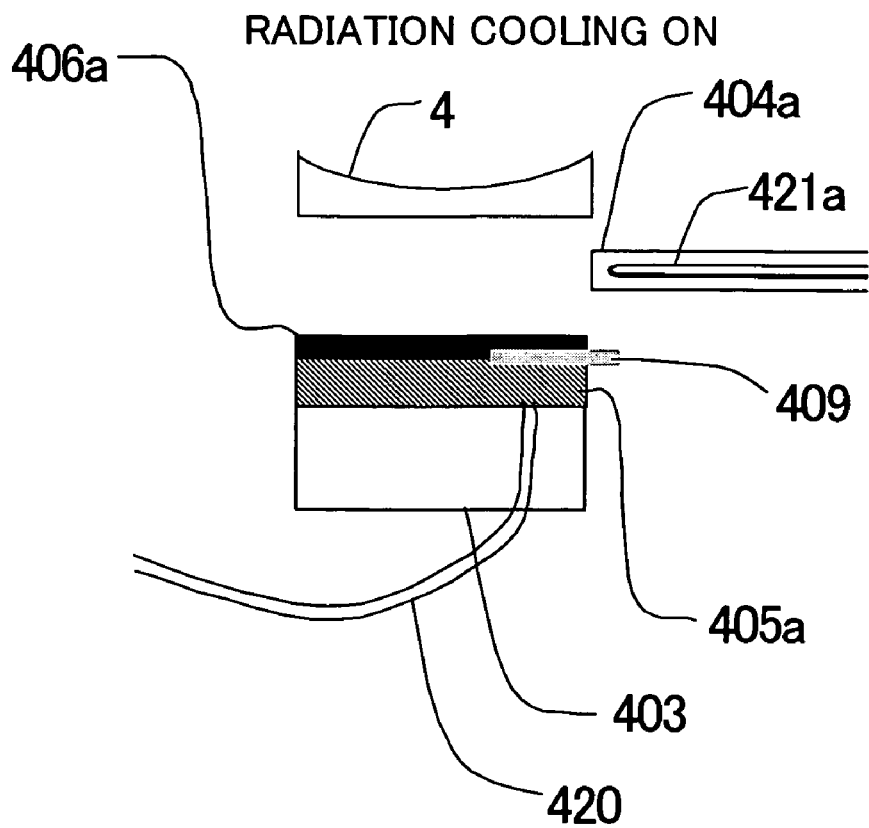
FIGS. 5A and 5B show a cooling mechanism part of a second embodiment according to the present invention.
Figure 5B:
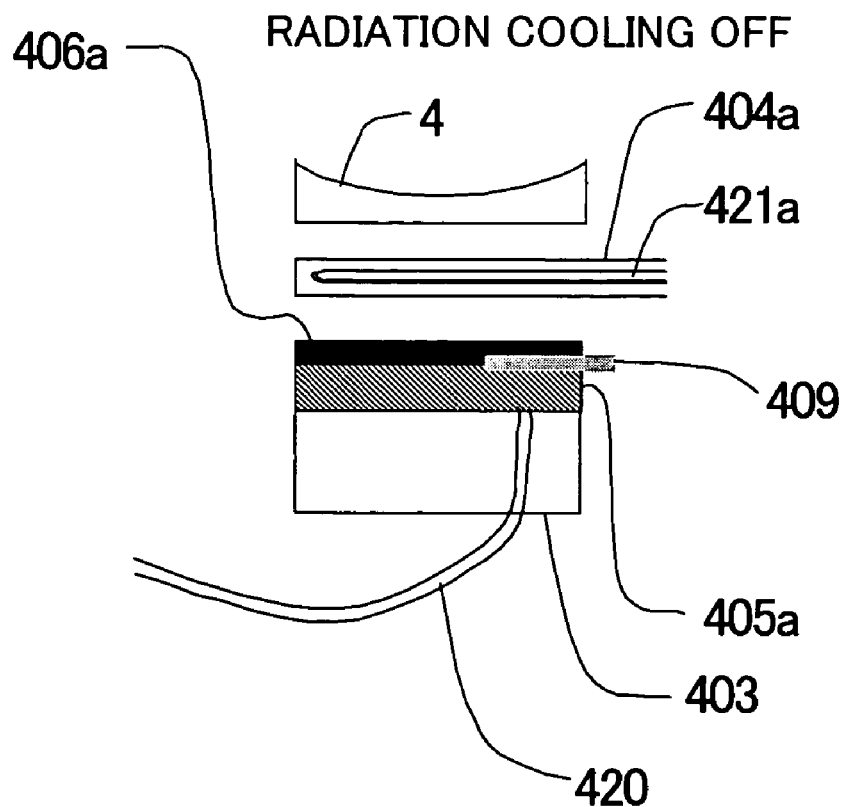

FIGS. 5A and 5B show a cooling mechanism for cooling a mirror in an exposure apparatus of a second embodiment according to the present invention. Those elements in FIGS. 5A and 5B other than the cooling mechanism in the exposure apparatus of this embodiment are the same as those in the first embodiment, and a description thereof will be omitted. Those elements in FIGS. 5A and 5B, which are corresponding elements in the first embodiment, are designated by the same reference numerals.

In order to cool the mirror 4, the radiation plate 406a is provided opposing to the rear surface of the mirror 4. The radiation shutter 404a is arranged between the mirror 4's rear surface and the radiation plate. The radiation shutter 404a is made from or covered with the low emissivity material. The radiation shutter 404a shields radiation emitting from the radiation plate 406a so that the radiations by the radiation plate 406a do not influence the mirror 4. As the temperature of the radiation shutter 404a changes, the radiation from the radiation shutter 404a affects the mirror 4. Accordingly, the pipe 421a for supplying the coolant to maintain the temperature of the radiation shutter 404a constant is provided in the shutter 404a. The temperature of the radiation plate is feedback-controlled based on the temperature measured by the temperature sensor 409. A pipe 420 for supplying the coolant is provided on the rear surface of the Peltier element 405a. The temperature of the radiation plate is adjusted using the Peltier element 405a by measuring the temperature of the radiation plate using the temperature sensor 409. When the exposure light is irradiated onto the mirror 4, the radiation shutter 404a opens and the radiation cooling turns on. When the exposure light is not irradiated onto the mirror 4, the radiation shutter 404a shuts and the radiation cooling turns off. Thereby, a responsive radiation cooling method can be realized.

Third Embodiment

Figure 6:
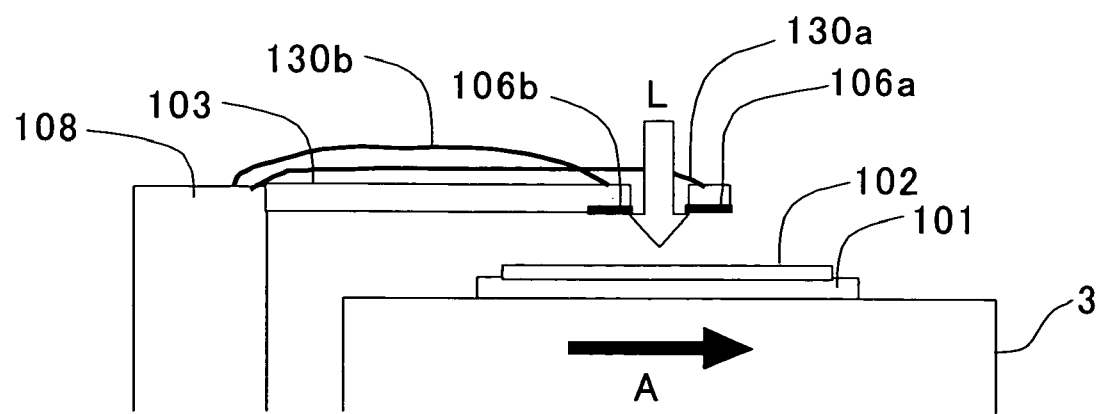
FIG. 6 is a schematic structure of a third embodiment according to the present invention.

FIG. 6 is a schematic structure around a peripheral of a wafer stage in an exposure apparatus of a third embodiment. Those elements in FIG. 6 other than the wafer stage in the exposure apparatus of this embodiment are the same as those in the first embodiment, and a description thereof will be omitted. Those elements in FIG. 6, which are corresponding elements in the first embodiment, are designated by the same reference numerals.

A temperature control pipe 130 is formed in the radiation plate and two types of mediums, i.e., a low temperature material and a material that has an almost ambient temperature ("ambient temperature material"), are switched and flowed to turn on and off the radiation.

Figure 7:
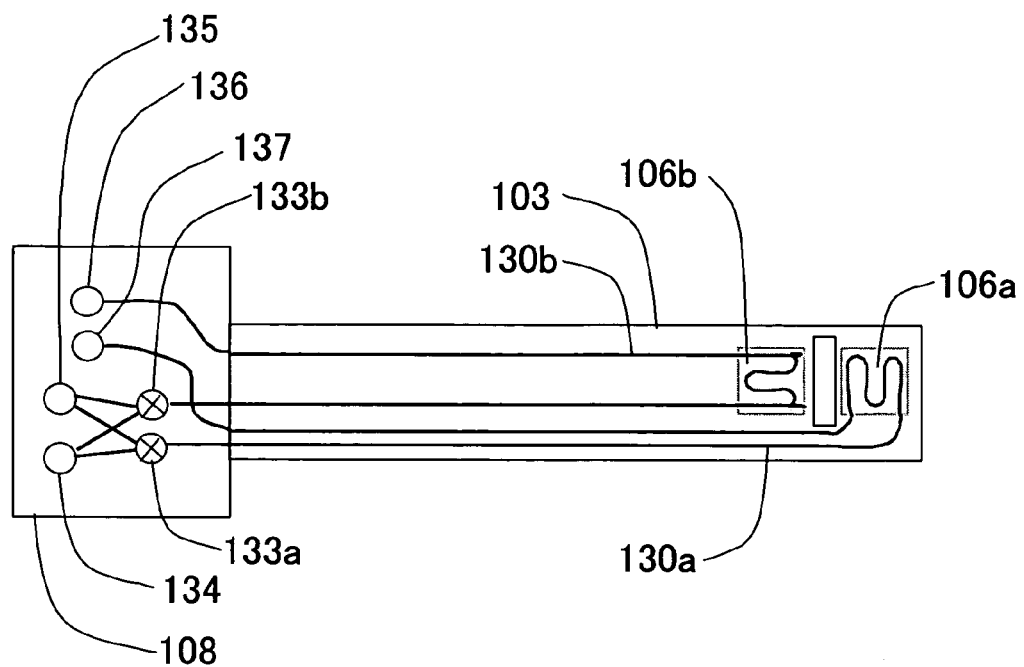
FIG. 7 shows a cooling mechanism part of the third embodiment according to the present invention.

FIG. 7 shows a cooling mechanism part of the third embodiment. A coolant switching valve 133 switches materials between the coolant and the ambient temperature material, and thereby provides responsive radiation cooling. 136 and 137 denote fluid collecting pipes. 134 denotes a coolant supply pipe. 135 denotes a pipe for the ambient temperature.

Figure 8:
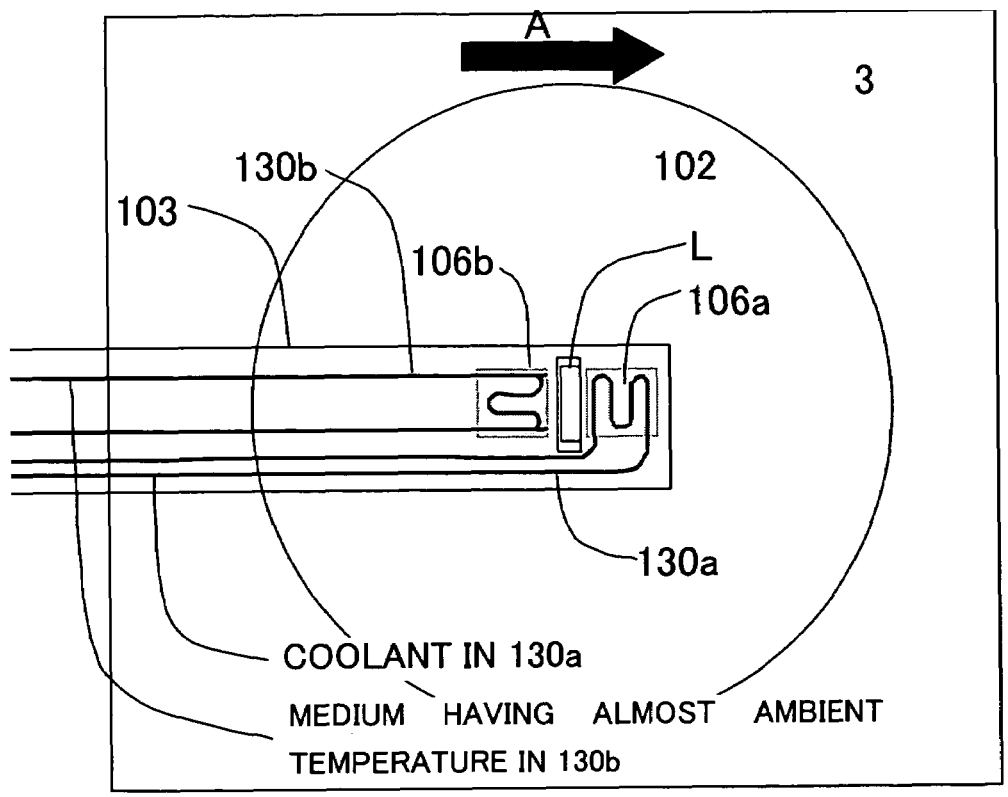
FIG. 8 shows switching of a radiation cooling position of the third embodiment according to the present invention.

FIG. 8 shows a method of switching cooling positions in the scan direction in the third embodiment. The coolant is supplied to the temperature control pipe 130a to the radiation plate 106a located at a side of the moving direction A viewed from the stage 3. The ambient temperature material is supplied to the temperature control pipe 130b to turn off the radiation plate 106b. As a result, the exposed part moves to a low temperature position opposing to the radiation plate 106a, and only the exposed part can be cooled just after the wafer 102 is exposed. When the moving direction A of the stage 3 is reversed, a cooling position is switched by supplying the ambient temperature material to the temperature control pipe 130a and the coolant to the temperature control pipe 130b. The radiation cooling stops when the exposure stops by supplying the ambient temperature material to the radiation plates 106a and 106b.

Thus, the instant embodiment flows the coolant in the radiation plate and controls the temperature of the object for radiation cooling. In addition, the instant embodiment flows the material having the almost ambient temperature to prevent heat flux between the radiation plate and the object, and to turn off the radiation cooling. The coolant switching valve regulates these actions, and provides a responsive temperature control.

In cooling the wafer, the instant embodiment does not cool the unexposed area on the wafer, and reduces the shrinkage of the wafer and the local distortion on the wafer caused by the excessive cooling to the unexposed area on the wafer.

Fourth Embodiment

Figure 9:
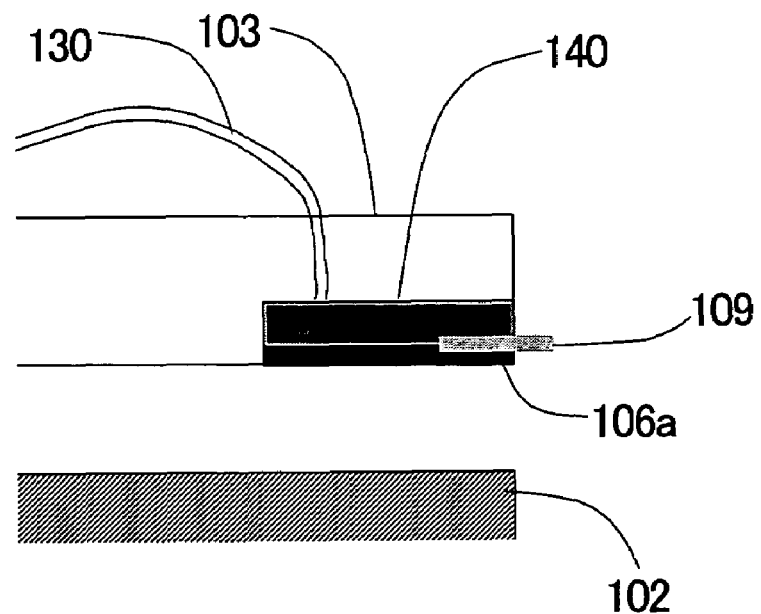
FIG. 9 shows switching of a radiation cooling position of a fourth embodiment according to the present invention.

FIG. 9 is a schematic structure of a cooling mechanism part in an exposure apparatus of a fourth embodiment. Those elements in FIG. 9 other than the wafer stage in the exposure apparatus of this embodiment are the same as those in the first embodiment, and a description thereof will be omitted. Those elements in FIG. 9, which are corresponding elements in the first embodiment, are designated by the same reference numerals.

The temperature of the radiation plate 106a held by the holder 103 is controlled by always flowing the coolant and adjusting a heating value of the heater 140.

When the radiation cooling is not used, the heater heats the radiation plate up to the almost ambient temperature. On the other hand, during the radiation cooling, the heating value of the heater is reduced to cool the radiation plate.

Similar to the above embodiments, this embodiment also provides effective cooling by arranging a radiation plate that is temperature-controlled by a heater in a scan direction and by removing the local thermal load irradiated onto the wafer when the scanner cools the wafer.

When the radiation turns off, the instant embodiment maintains the radiation plate at the almost ambient temperature using the heater, and controls the temperature of the radiation plate in accordance with the states of the object, providing the responsive radiation cooling.

The above embodiment uses the scanner (that follows a step-and-repeat manner). However, the present invention is not limited to this type, and is applicable to a step-and-repeat exposure apparatus that entirely exposes each shot on the object.

While the exposure apparatuses of the above embodiments use the EUV light as exposure light, the electron beam can be used. Since the electron-beam exposure requires a longer time to expose the object than the exposure that uses the light, the object causes a large local distortion as the unexposed area is cooled on the object. An application of the present invention to the exposure apparatus has a larger effect.

Fifth Embodiment

Figure 10:
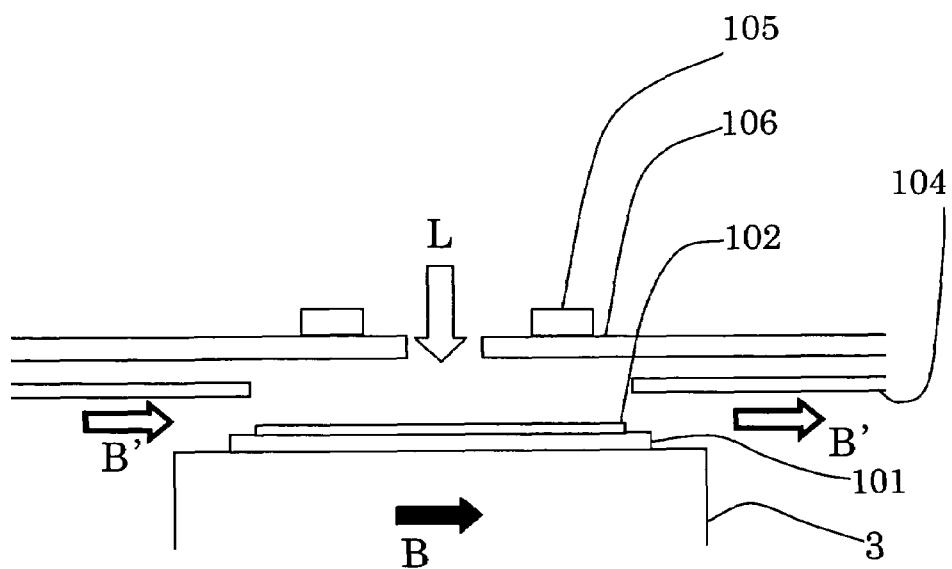
FIG. 10 shows switching of a cooling mechanism of a fifth embodiment according to the present invention.
Figure 11:
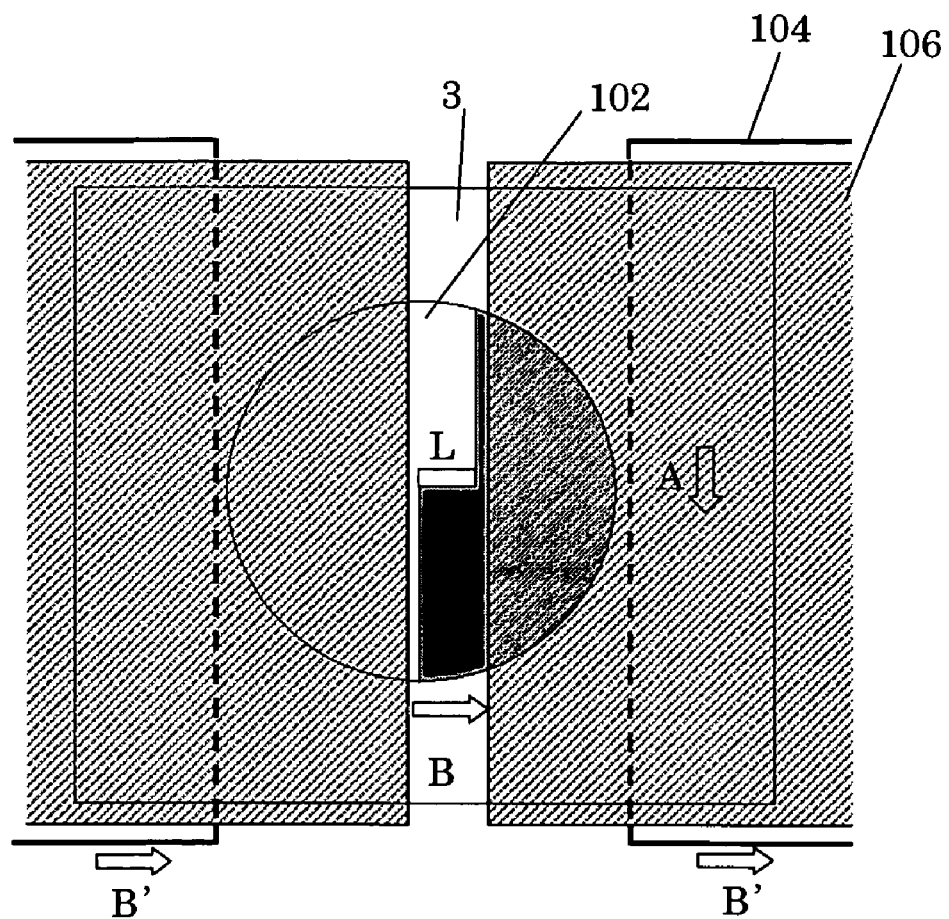
FIG. 11 shows switching of a cooling mechanism of a fifth embodiment according to the present invention.

FIGS. 10 and 11 are schematic structures of a cooling mechanism part of a fifth embodiment. A Peltier element 105 controls the temperature of the radiation plate 106. A rear surface of the Peltier element 105 is radiated by flowing the coolant (not shown). The radiation plate 106 in the instant embodiment opposes to the entire front surface of the wafer 102 and cools the entire surface of the wafer 102. An arrow B indicates a moving direction of the wafer stage, while an arrow A indicates a moving direction of the wafer stage in the scan time. The shutter 104 shields radiation between the radiation plate and the wafer to restrain the thermal influence by the radiation plate 106 on an element other than the wafer 102. In synchronization with movements of the wafer stage, a radiation plate driver (not shown) moves the shutter 104. The arrow B' indicates the shutter's moving direction. Synchronous movements between the wafer stage and the shutter can limit the area cooled by the radiation plate only to the wafer in the step direction.

The scan direction also uses a similar mechanism and moves the radiation plate in synchronization with the wafer stage's scan so as to limit the area cooled by the radiation plate only to the wafer in the scan direction.

Sixth Embodiment

Figure 12:
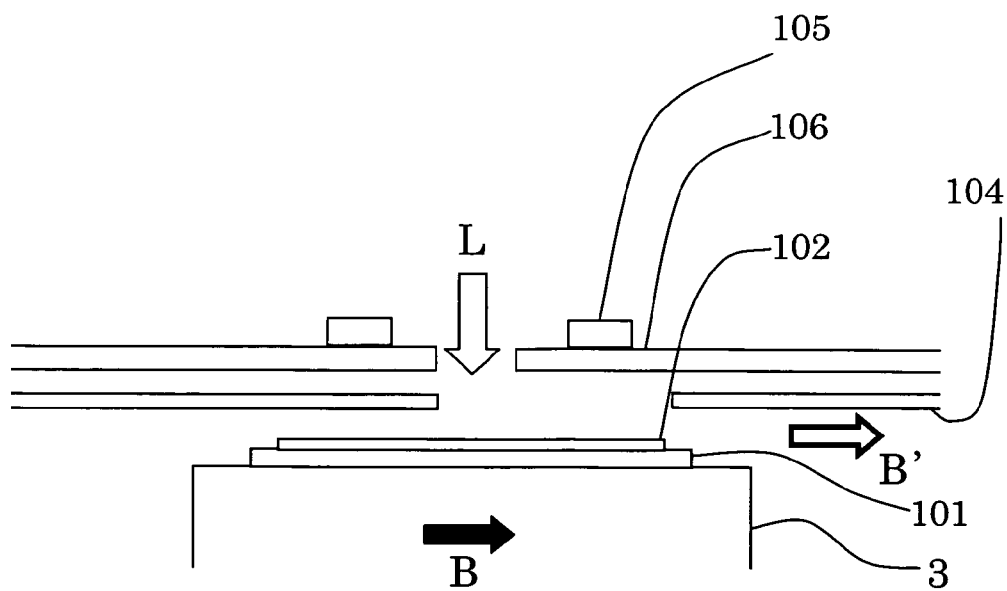
FIG. 12 shows switching of a cooling mechanism of a sixth embodiment according to the present invention.
Figure 13:
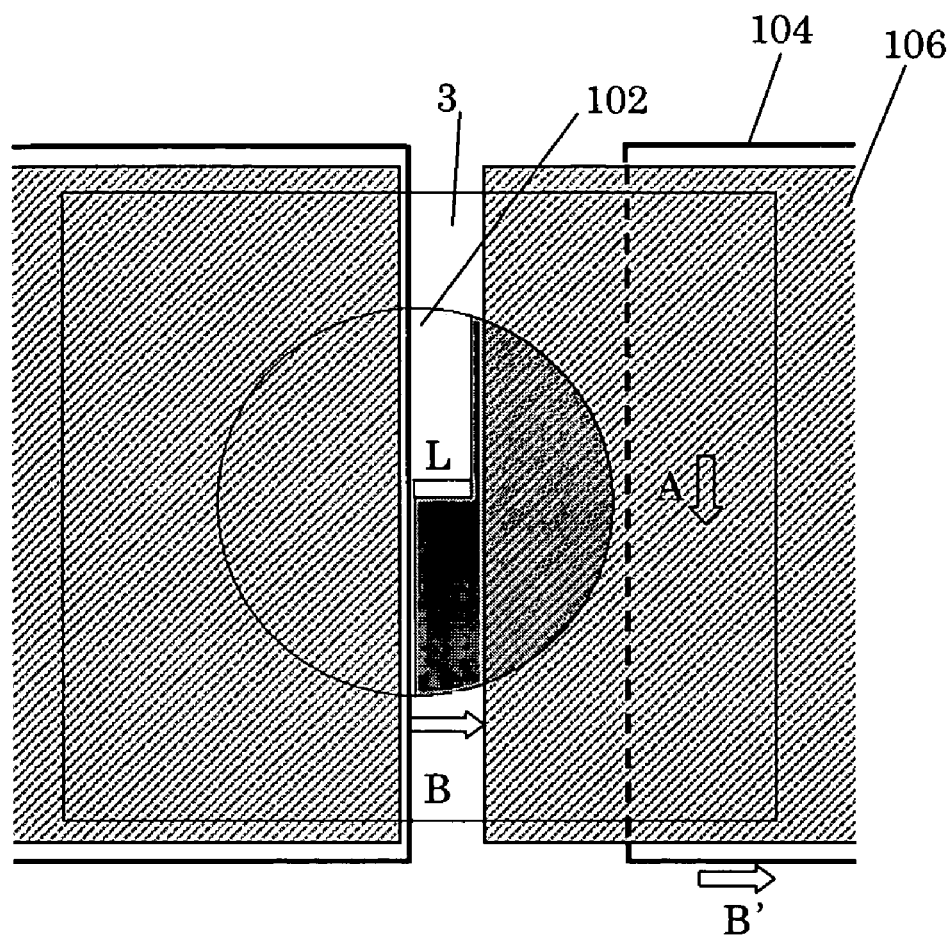
FIG. 13 shows switching of a cooling mechanism of a sixth embodiment according to the present invention.

FIGS. 12 and 13 are schematic structures of the cooling mechanism part of a sixth embodiment that steps the wafer stage 3 in almost one direction. Since the wafer is exposed in almost one direction from one end to the other end, the wafer's temperature rises not entirely but only on one side. When this wafer is entirely cooled, the exposure-light non-irradiated area is also cooled and its temperature lowers, causing a large temperature distribution on the entire wafer surface. Accordingly, the instant embodiment uses the shutter 104 to shield the exposure-light non-irradiated area to avoid cooling. The shutter 104 closes around the exposure-light irradiated area and stays there for the exposure-light non-irradiated area, whereas the shutter 104 opens the wafer to the end and moves in synchronization with the wafer stage 3 for the exposure-light irradiated area. This can limit the cooling area only to the exposure-light irradiated area for the step direction, and reduce the temperature distribution on the wafer surface.

When the stage scans in the almost one direction, the scan direction use a similar mechanism and moves the radiation plate in synchronization with the wafer stage's scan so as to limit the area cooled by the radiation plate only to the exposure-light irradiated area in the scan direction.

Seventh Embodiment

Figure 14:
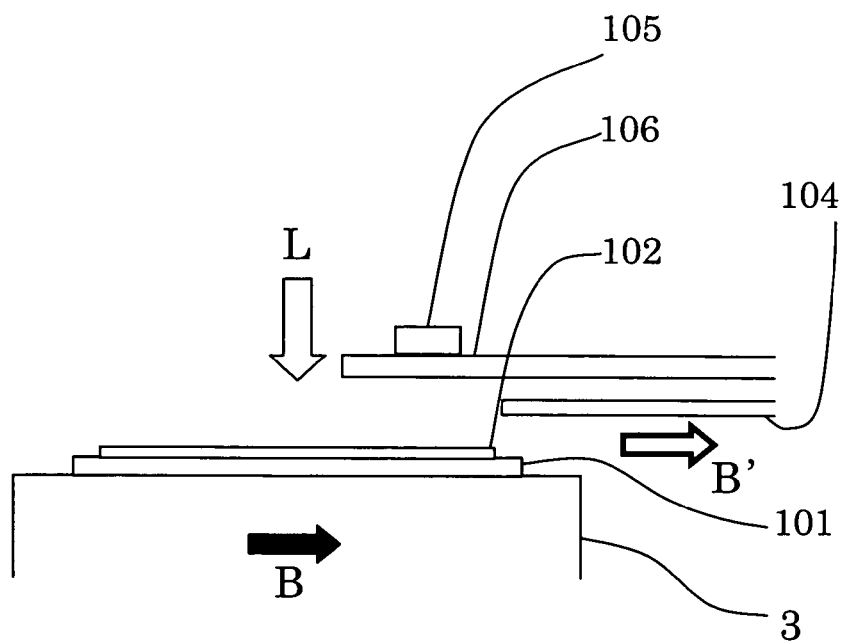
FIG. 14 shows switching of a cooling mechanism of a seventh embodiment according to the present invention.

FIG. 14 is a schematic structure of the cooling mechanism part of a seventh embodiment. The seventh embodiment eliminates the cooling mechanism for the area that does not receive the exposure light in the sixth embodiment. An arrangement in which the scan direction and the step direction are set to always one direction provides the same effect as that of the fifth embodiment.

Eighth Embodiment

Figure 15:
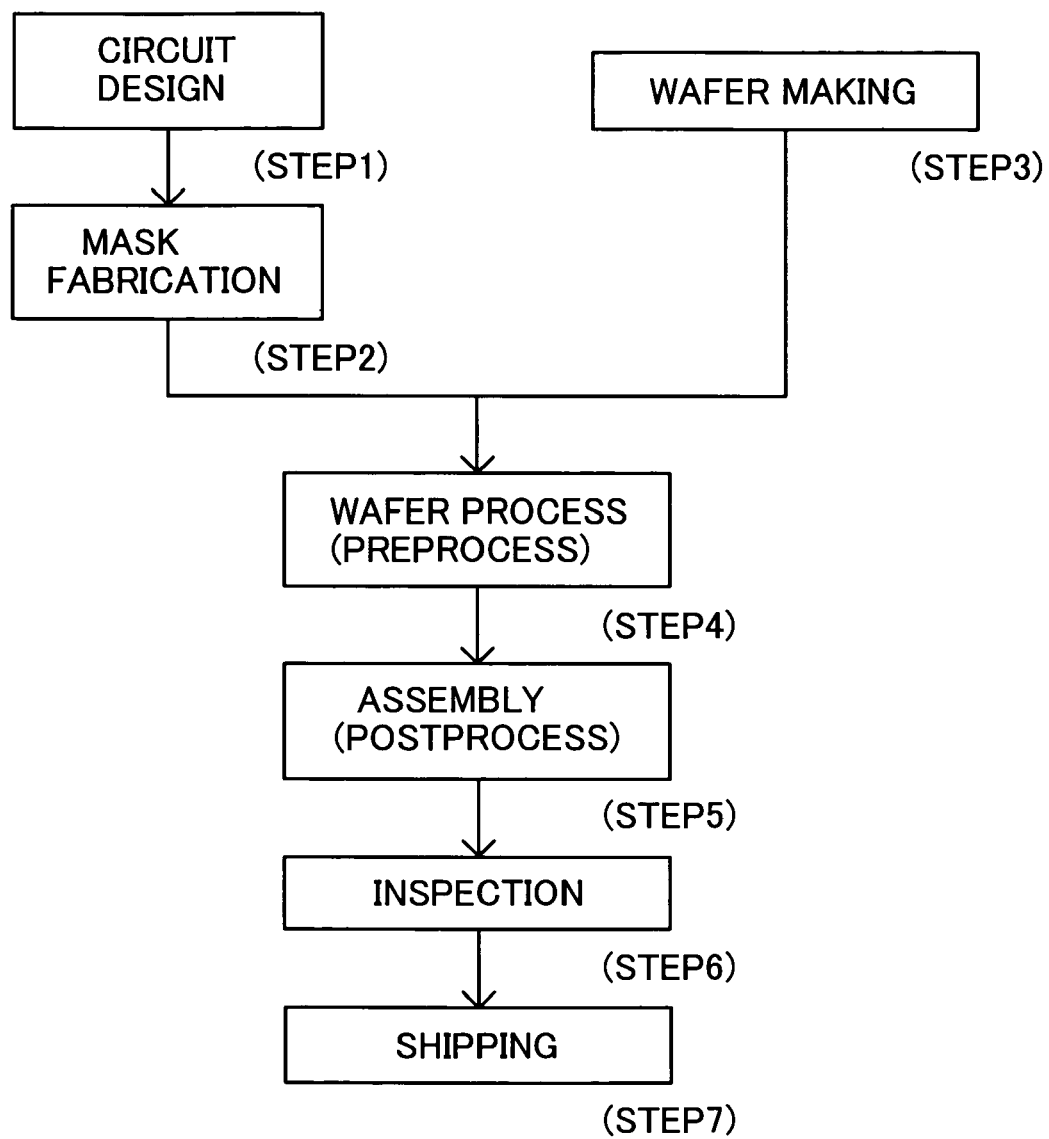
FIG. 15 is a device manufacture flow.
Figure 16:
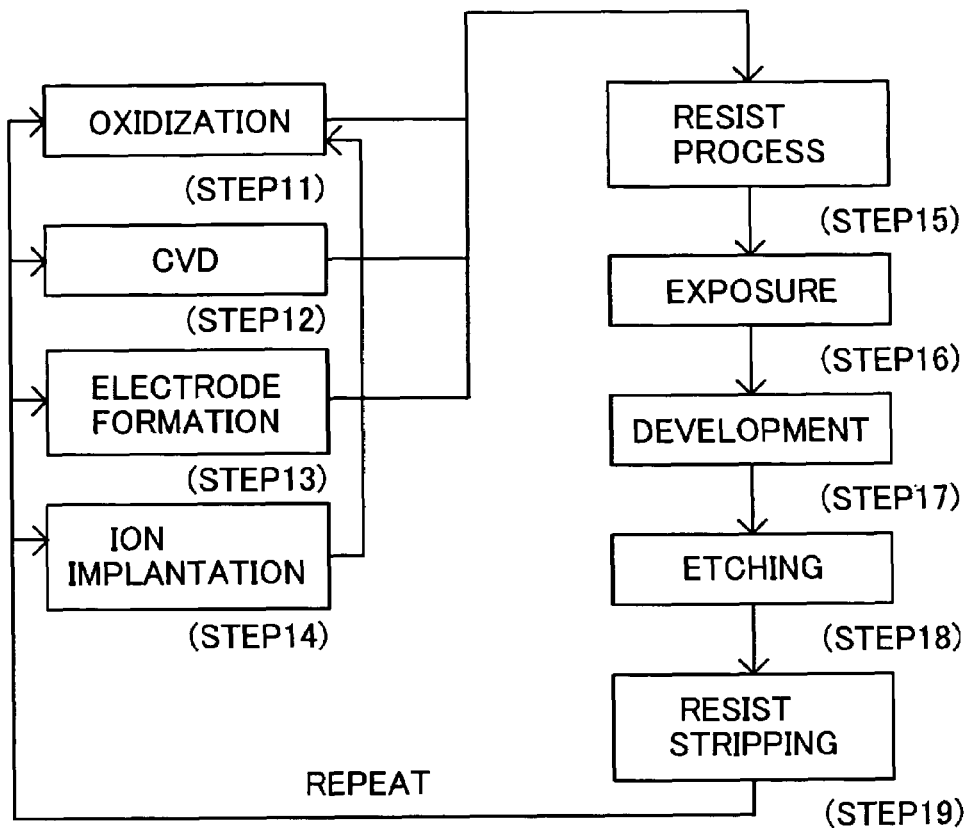
FIG. 16 is a wafer process shown in FIG. 15.

Referring now to FIGS. 15 and 16, a description will be given of an embodiment of a device fabricating method using the above exposure apparatus. FIG. 15 is a manufacture flow of semiconductor devices, such as semiconductor chips, for example, ICs and LSIs, liquid crystal panels and CCDs. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 16 is a detailed flowchart of the wafer process. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture a higher quality device than the conventional method.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus configured to expose a substrate, said exposure apparatus comprising:
   an optical system configured to introduce exposure light to the substrate;
   a cooling mechanism configured to cool the substrate through radiation; and
   a regulator configured to selectively regulate an amount of radiant of said cooling mechanism applied to different areas on the substrate so that
   a radiant amount of part of said cooling mechanism used to cool an unexposed area on the substrate is smaller than a radiant amount of part of said cooling mechanism used to cool an exposed area on the substrate.

2. An exposure apparatus configured to expose a substrate by scanning exposure light, said exposure apparatus comprising:
   an optical system configured to introduce exposure light to the substrate;
   a cooling mechanism configured to cool the substrate through radiation; and
   a regulator configured to selectively regulate an amount of radiant of said cooling mechanism applied to different areas on the substrate so that
   a radiant amount of part of said cooling mechanism used to cool an area on the subject at a side of an exposed area opposing to a scan direction is smaller than a radiant amount of part of said cooling mechanism used to cool an area on the subject at a scan direction side of the exposed area.

3. An exposure apparatus configured to expose a substrate, said exposure apparatus comprising:
   an optical system configured to introduce exposure light into the substrate;
   a cooling mechanism configured to cool the substrate through radiation; and
   a regulator configured to selectively regulate a radiant amount of said cooling mechanism applied to different areas on the substrate.

4. An exposure apparatus according to claim 3, wherein said cooling mechanism includes a radiation plate, and said regulator includes a shutter located between the radiation plate and the substrate.

5. An exposure apparatus according to claim 4, further comprising a temperature controller configured to control a temperature of the shutter.

6. An exposure apparatus according to claim 4, wherein the shutter has a lower emissivity than the radiation plate.

7. An exposure apparatus according to claim 4, wherein said regulator opens the shutter when the exposure light is irradiated onto the optical element, and closes the shutter when the exposure light is not irradiated onto the optical element.

8. An exposure apparatus according to claim 3, wherein said cooling mechanism includes a radiation plate, and said exposure apparatus further comprises a temperature controller configured to control a temperature of the radiation plate.

9. A device fabrication method comprising the steps of:
exposing an object using an exposure apparatus according to claim 3; and
developing the object that has been exposed.

10. An exposure apparatus configured to expose a wafer using exposure light, said exposure apparatus comprising:
a wafer stage configured to hold the wafer;
an optical system configured to introduce the exposure light to the wafer held by the wafer stage;
a radiation plate configured to radiate the wafer held by the wafer stage; and
a shutter located between the radiation plate and the wafer, and configured to move in synchronization with movements of the wafer stage, and to shield an unexposed area on the wafer so as to keep the unexposed area from a radiation by the radiation plate.

11. A device fabrication method comprising the steps of:
exposing a wafer using an exposure apparatus according to claim 10; and
developing the wafer that has been exposed.

12. An exposure apparatus configured to expose a wafer using light in a vacuum environment, said exposure apparatus comprising:
a wafer stage configured to hold and move the wafer;
a pair of radiation plates arranged in a moving direction of the wafer stage, and located above the wafer, a space between the pair of radiation plates forming an exposure region though which the light transmits to the wafer; and
a pair of shutters each configured to open one of the radiation plates and the exposure region to the wafer and to close the other of the radiation plates to the wafer during exposure, the one being located downstream to the exposure region in the moving direction, the other being located upstream to the exposure region in the moving direction, and each shutter having a lower emissivity than each radiation plate.

13. An exposure apparatus according to claim 12, wherein the pair of shutters closes both radiation plates to the wafer during non-exposure.

14. A device fabrication method comprising the steps of:
exposing a wafer using an exposure apparatus according to claim 12, and
developing the wafer that has been exposed.

15. An exposure apparatus configured to expose a wafer using light in a vacuum environment, said exposure apparatus comprising:
a wafer stage configured to hold and move the wafer;
a pair of radiation plates arranged in a moving direction of the wafer stage, and located above the wafer, a space between the pair of radiation plates forming an exposure region though which the light transmits to the wafer;
a pair of temperature control pipes each connected to a corresponding one of the radiation plates, and configured to circulate through the radiation plates two types of coolants having different temperatures, a higher temperature coolant having the same temperature as the vacuum environment; and
a coolant switching valve configured to circulate a lower temperature coolant through one of the radiation plates located downstream to the exposure region in the moving direction and to circulate the higher temperature coolant through the other of the radiation plates located upstream to the exposure region in the moving direction during exposure.

16. A device fabrication method comprising the steps of:
exposing a wafer using an exposure apparatus according to claim 15; and
developing the wafer that has been exposed.

17. An exposure apparatus configured to expose a wafer using light in a vacuum environment, said exposure apparatus comprising:
a wafer stage configured to hold and move the wafer;
a pair of radiation plates arranged in a moving direction of the wafer stage, and located above the wafer, a space between the pair of radiation plates forming an exposure region though which the light transmits to the wafer;
a pair of temperature control pipes each connected to a corresponding one of the radiation plates, and configured to circulate through the radiation plates a coolant; and
a pair of heater each connected to a corresponding one of the radiation plates, and configured to turn off for one of the radiation plates located downstream to the exposure region in the moving direction and turn on for the other of the radiation plates located upstream to the exposure region in the moving direction during exposure.

18. A device fabrication method comprising the steps of:
exposing a wafer using an exposure apparatus according to claim 17; and
developing the wafer that has been exposed.

19. An exposure apparatus configured to expose a wafer in a step-and-scan manner using light in a vacuum environment, said exposure apparatus comprising:
a wafer stage configured to hold and move the wafer, and to move in a first direction during scanning and in a second direction orthogonal to the first direction during stepping;
a pair of radiation plates arranged in the second direction, and located above the wafer, a space between the pair of radiation plates forming an exposure region though which the light transmits to the wafer; and
a pair of shutters arranged in the second direction, spaced from each other by a distance enough to open both radiation plates to the wafer, and configured to move in synchronization with stepping of the wafer stage, and each shutter having a lower emissivity than each radiation plate.

20. An exposure apparatus according to claim 19, further comprising another pair of shutters arranged in the first direction, spaced from each other by a distance enough to open both radiation plates to the wafer, and configured to move in synchronization with scanning of the wafer stage.

21. A device fabrication method comprising the steps of:
exposing a wafer using an exposure apparatus according to claim 19; and
developing the wafer that has been exposed.

* * * * *